US011245166B2

(12) United States Patent
Tsuru

(10) Patent No.: US 11,245,166 B2
(45) Date of Patent: Feb. 8, 2022

(54) HIGH FREQUENCY MIXER

(71) Applicant: Mitsubishi Electric Corporation, Tokyo (JP)

(72) Inventor: Masaomi Tsuru, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 147 days.

(21) Appl. No.: 16/608,764

(22) PCT Filed: May 29, 2017

(86) PCT No.: PCT/JP2017/019893
§ 371 (c)(1),
(2) Date: Oct. 25, 2019

(87) PCT Pub. No.: WO2018/220669
PCT Pub. Date: Dec. 6, 2018

(65) Prior Publication Data
US 2021/0119312 A1    Apr. 22, 2021

(51) Int. Cl.
H01P 1/185    (2006.01)
H01P 5/18     (2006.01)
H03D 7/02     (2006.01)
H01P 1/213    (2006.01)

(52) U.S. Cl.
CPC ............ H01P 1/185 (2013.01); H01P 1/213 (2013.01); H01P 5/18 (2013.01); H03D 7/02 (2013.01)

(58) Field of Classification Search
CPC . H01P 1/185; H01P 1/213; H01P 5/18; H03D 7/02
USPC ............................... 333/24 R, 139, 156, 161
See application file for complete search history.

(56) References Cited

U.S. PATENT DOCUMENTS 3,659,206 A    4/1972  Hallford
2010/0013698 A1*  1/2010  Borlez ................ H03D 9/0633
                                                          342/61

FOREIGN PATENT DOCUMENTS

| JP | 3-27604 A   | 2/1991  |
| JP | 9-18238 A   | 1/1997  |
| JP | 9-326640 A  | 12/1997 |
| JP | 2796360 B2  | 9/1998  |
| JP | 11-127034 A | 5/1999  |

(Continued)

OTHER PUBLICATIONS

European Office Action for European Application No. 17912094.4, dated Apr. 22, 2021.

(Continued)

Primary Examiner — Robert J Pascal
Assistant Examiner — Jorge L Salazar, Jr.
(74) Attorney, Agent, or Firm — Birch, Stewart, Kolasch & Birch, LLP

(57) ABSTRACT

A first phase shift circuit (2) converts impedance to achieve impedance matching between a third terminal (1c) of a 90-degree hybrid circuit (1) and a first terminal (4a) of a first nonlinear element (4), and shifts a phase of a radio wave by 180 degrees, and a second phase shift circuit (3) converts impedance to achieve impedance matching between a fourth terminal (1d) of the 90-degree hybrid circuit (1) and a first terminal (5a) of a second nonlinear element (5), and shifts a phase of a radio wave by 90 degrees. As a result of this configuration, a conversion loss of radio waves can be reduced.

10 Claims, 4 Drawing Sheets

(56) References Cited

FOREIGN PATENT DOCUMENTS

KR    10-2006-0002689 A    1/2006

OTHER PUBLICATIONS

Partial Supplementary European Search Report for European Application No. 17912094.4, dated Apr. 21, 2020.
Extended European Search Report for European Application No. 17912094.4, dated Aug. 14, 2020.
European Summons to attend oral proceedings pursuant to Rule 115(1) EPC dated Nov. 15, 2021 for Application No. 17 912 094.4.

* cited by examiner

Smith Char

Smith Chart

Smith Chart

HIGH FREQUENCY MIXER

TECHNICAL FIELD

The present invention relates to a high frequency mixer provided with a 90-degree hybrid circuit.

BACKGROUND ART

Patent Literature 1 listed below discloses a high frequency mixer including a 90-degree hybrid circuit and first and second diodes.

Hereinafter, a case where this high frequency mixer operates as a reception mixer will be described.

The 90-degree hybrid circuit has first to fourth terminals. An LO wave which is a local oscillation wave is input through the first terminal, and an RF signal which is a high frequency signal is input through the second terminal.

Thus, the 90-degree hybrid circuit outputs an LO wave with a phase of 0 degrees and an RF signal with a phase of −90 degrees from the third terminal, and an LO wave with a phase of −90 degrees and an RF signal with a phase of 0 degrees from the fourth terminal.

The anode of the first diode is connected to the third terminal of the 90-degree hybrid circuit via a transmission line having a length of a quarter wavelength at the frequency of the LO wave. The frequency of the LO wave and the frequency of the RF signal are approximately equal.

Therefore, the transmission line shifts the phase of the LO wave output from the third terminal of the 90-degree hybrid circuit by −90 degrees, and shifts the phase of the RF signal output from the third terminal of the 90-degree hybrid circuit by about −90 degrees.

As a result, the anode of the first diode is supplied with the LO wave with a phase of −90 degrees and the RF signal with a phase of approximately 180 degrees.

The cathode of the first diode is short-circuited at the frequency of the LO wave by an open circuited stub, and the first diode performs a switching operation in accordance with the amplitude of the LO wave, thereby generating a mixed wave of the LO wave and the RF signal.

The mixed wave of the LO wave and the RF signal is a difference frequency signal between the frequency of the LO wave and the frequency of the RF signal, and the difference frequency signal is hereinafter referred to as a first IF signal. The phase of the first IF signal output from the cathode of the first diode is approximately −90 degrees.

The cathode of the second diode is connected to the fourth terminal of the 90-degree hybrid circuit.

As a result, the cathode of the second diode is supplied with the LO wave with a phase of −90 degrees and the RF signal with a phase of 0 degrees.

The anode of the second diode is short-circuited at the frequency of the LO wave by an open circuited stub, and the second diode performs a switching operation in accordance with the amplitude of the LO wave, thereby generating a mixed wave of the LO wave and the RF signal.

The mixed wave of the LO wave and the RF signal is a difference frequency signal between the frequency of the LO wave and the frequency of the RF signal, and the difference frequency signal is hereinafter referred to as a second IF signal.

Since the direction of the first diode and the direction of the second diode are opposite to each other, the phase of the second IF signal output from the anode of the second diode is −90 degrees.

The frequency of the first IF signal output from the cathode of the first diode and the frequency of the second IF signal output from the anode of the second diode are approximately equal to each other, and therefore, they are synthesized approximately in phase and output.

The RF signal output from the cathode of the first diode and the RF signal output from the anode of the second diode are approximately cancelled because they are in reverse phase.

CITATION LIST

Patent Literatures

Patent Literature 1: JP H03-27604 A (JP 1991-27604 A)

SUMMARY OF INVENTION

Technical Problem

In the conventional high frequency mixer including a 90-degree hybrid circuit and first and second diodes, the input impedance of the first and second diodes is higher than the output impedance of the third and fourth terminals of the 90-degree hybrid circuit. Thus, the impedance mismatch between the 90-degree hybrid circuit and the first and second diodes increases. As a result, the conventional high frequency mixer entails a problem that, when the high frequency mixer operates as a reception mixer, a conversion loss from RF signal to IF signal increases, and when the high frequency mixer operates as a transmission mixer, a conversion loss from IF signal to RF signal increases.

The present invention has been made to solve the foregoing problems, and an object of the present invention is to obtain a high frequency mixer capable of reducing a conversion loss of radio waves.

Solution to Problem

The high frequency mixer according to the present invention includes: a 90-degree hybrid circuit including first to fourth terminals, the second terminal being an isolation terminal, the third terminal being a 0-degree output terminal, and the fourth terminal being a −90-degree output terminal when the first terminal is an input terminal for a radio wave; a first phase shift circuit converting impedance to achieve impedance matching between the third terminal of the 90-degree hybrid circuit and a first terminal of a first nonlinear element, and shifting a phase of a radio wave by 180 degrees; and a second phase shift circuit converting impedance to achieve impedance matching between the fourth terminal of the 90-degree hybrid circuit and a second terminal of a second nonlinear element, and shifting a phase of a radio wave by 90 degrees.

Advantageous Effects of Invention

According to the present invention, the first phase shift circuit converts impedance so as to achieve impedance matching between the third terminal of the 90-degree hybrid circuit and the first terminal of the first nonlinear element, and shifts the phase of the radio wave by 180 degrees, and the second phase shift circuit converts impedance so as to achieve impedance matching between the fourth terminal of the 90-degree hybrid circuit and the second terminal of the second nonlinear element, and shifts the phase of the radio wave by 90 degrees, whereby an effect of reducing a conversion loss of radio waves is obtained.

DESCRIPTION OF EMBODIMENTS

Hereinafter, in order to describe the present invention in more detail, some embodiments for carrying out the present invention will be described with reference the accompanying drawings.

First Embodiment

In a first embodiment, an example in which a high frequency mixer operates as a reception mixer will be described.

Figure 1:
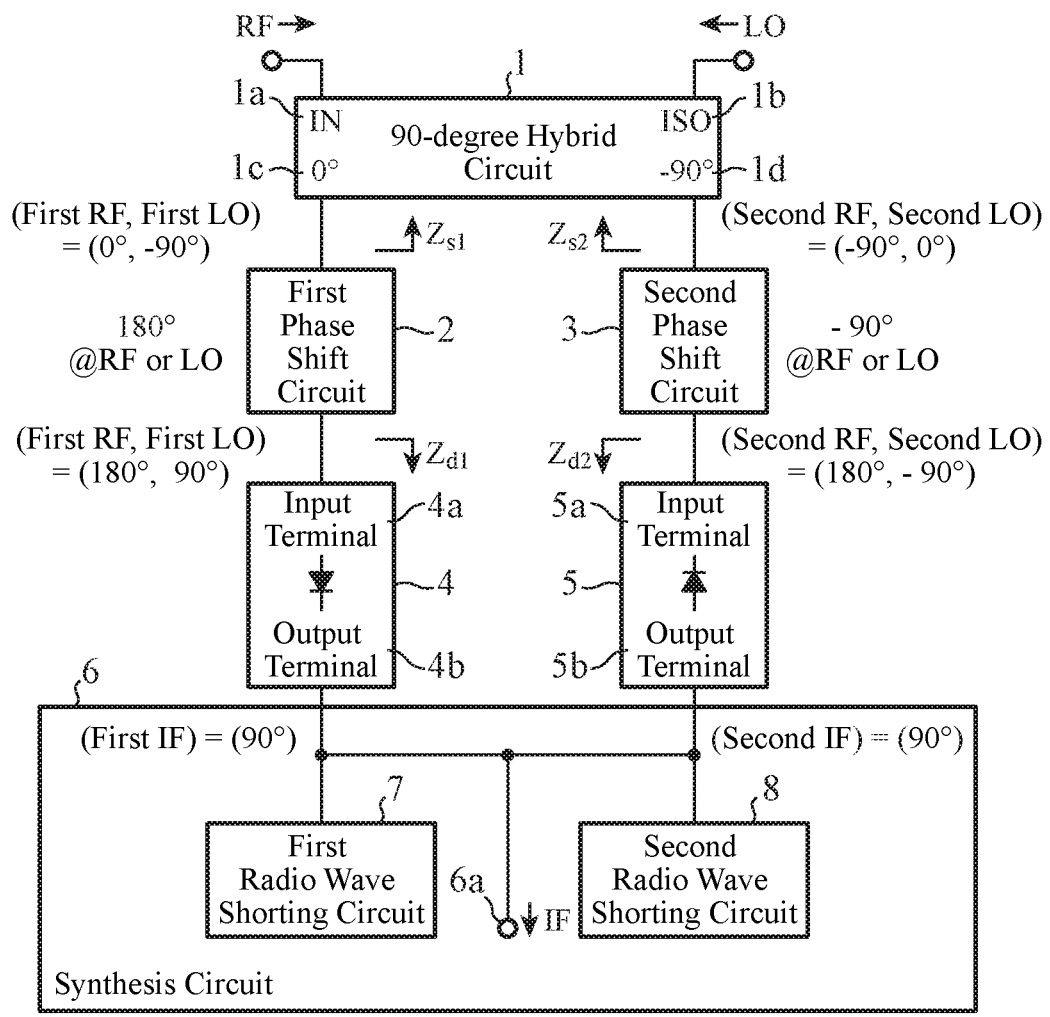
FIG. 1 is a block diagram showing a high frequency mixer according to a first embodiment of the present invention.

FIG. 1 is a block diagram showing a high frequency mixer according to the first embodiment of the present invention.

In FIG. 1, a 90-degree hybrid circuit 1 has a first terminal 1a, a second terminal 1b, a third terminal 1c, and a fourth terminal 1d, and when the first terminal 1a functions as an input terminal for radio waves, the second terminal 1b functions as an isolation terminal, the third terminal 1c functions as a 0-degree output terminal, and the fourth terminal 1d functions as a −90-degree output terminal.

In the example in FIG. 1, an RF signal (radio wave) which is a high frequency signal is input through the first terminal 1a of the 90-degree hybrid circuit 1, and an LO wave (radio wave) which is a local oscillation wave is input through the second terminal 1b of the 90-degree hybrid circuit 1.

The RF signal input through the first terminal 1a of the 90-degree hybrid circuit 1 is equally distributed to the third terminal 1c and the fourth terminal 1d without being output to the second terminal 1b. The first RF signal (first radio wave) distributed to the third terminal 1c and the second RF signal (second radio wave) distributed to the fourth terminal 1d have a phase difference of 90 degrees.

The LO wave input through the second terminal 1b of the 90-degree hybrid circuit 1 is equally distributed to the third terminal 1c and the fourth terminal 1d without being output to the first terminal 1a. The first LO wave (third radio wave) distributed to the third terminal 1c and the second LO wave (fourth radio wave) distributed to the fourth terminal 1d also have a phase difference of 90 degrees.

In the example in FIG. 1, the phase of the first RF signal output from the third terminal 1c is 0 degrees, the phase of the first LO wave output from the third terminal 1c is −90 degrees, the phase of the second RF signal output from the fourth terminal 1d is −90 degrees, and the phase of the second LO wave output from the fourth terminal 1d is 0 degrees.

The first phase shift circuit 2 shifts the phase of the first RF signal output from the third terminal 1c of the 90-degree hybrid circuit 1 from 0 degrees to 180 degrees by shifting the phase of the first RF signal by 180 degrees, and outputs the phase-shifted first RF signal to a first nonlinear element 4.

Further, the first phase shift circuit 2 shifts the phase of the first LO wave output from the third terminal 1c of the 90-degree hybrid circuit 1 from −90 degrees to 90 degrees by shifting the phase of the first LO wave by 180 degrees, and outputs the phase-shifted first LO wave to the first nonlinear element 4.

The first phase shift circuit 2 has a function of achieving impedance matching between output impedance $Z_{s1}$ at the third terminal 1c of the 90-degree hybrid circuit 1 and input impedance $Z_{d1}$ at the input terminal 4a of the first nonlinear element 4.

The second phase shift circuit 3 shifts the phase of the second RF signal output from the fourth terminal 1d of the 90-degree hybrid circuit 1 from −90 degrees to 180 degrees by shifting the phase of the second RF signal by −90 degrees, and outputs the phase-shifted second RF signal to a second nonlinear element 5. The second RF signal after the phase shift by the second phase shift circuit 3 is in phase with the first RF signal after the phase shift by the first phase shift circuit 2.

Further, the second phase shift circuit 3 shifts the phase of the second LO wave output from the fourth terminal 1d of the 90-degree hybrid circuit 1 from 0 degrees to −90 degrees by shifting the phase of the second LO wave by −90 degrees, and outputs the phase-shifted second LO wave to the second nonlinear element 5. The second LO wave after the phase shift by the second phase shift circuit 3 is opposite in phase to the first LO wave after the phase shift by the first phase shift circuit 2.

The second phase shift circuit 3 has a function of achieving impedance matching between an output impedance $Z_{s2}$ at the fourth terminal 1d of the 90-degree hybrid circuit 1 and an input impedance $Z_{d2}$ at the input terminal 5a of the second nonlinear element 5.

The first nonlinear element 4 is implemented by, for example, a diode, in which the input terminal 4a which is a first terminal of the first nonlinear element 4 corresponds to an anode which is an anode terminal of the diode, and the output terminal 4b which is a second terminal of the first nonlinear element 4 corresponds to a cathode which is a cathode terminal of the diode.

The first nonlinear element 4 mixes the first RF signal output from the first phase shift circuit 2 with the first LO wave output from the first phase shift circuit 2 to generate a first IF signal (first mixed wave), and outputs the first IF signal to a synthesis circuit 6.

The second nonlinear element 5 is implemented by, for example, a diode, in which the input terminal 5a which is a second terminal of the second nonlinear element 5 corresponds to a cathode which is a cathode terminal of the diode, and the output terminal 5b which is a first terminal of the second nonlinear element 5 corresponds to an anode which is an anode terminal of the diode.

The second nonlinear element 5 mixes the second RF signal output from the second phase shift circuit 3 with the second LO wave output from the second phase shift circuit 3 to generate a second IF signal (second mixed wave) which is in phase with the first IF signal, and outputs the second IF signal to the synthesis circuit 6.

As the diode for implementing each of the first nonlinear element 4 and the second nonlinear element 5, a PN junction diode can be used, and further, a Schottky barrier diode or the like can also be used.

The synthesis circuit 6 includes a first radio wave shorting circuit 7 and a second radio wave shorting circuit 8.

The synthesis circuit 6 synthesizes the first IF signal output from the first nonlinear element 4 and the second IF signal output from the second nonlinear element 5 in phase, and outputs an IF signal which is the result of the in-phase synthesis to the outside from an input/output terminal 6a.

The first radio wave shorting circuit 7 short-circuits the output terminal 4b of the first nonlinear element 4 at the frequency of the RF signal input through the first terminal 1a of the 90-degree hybrid circuit 1 or at the frequency of the LO wave input through the second terminal 1b of the 90-degree hybrid circuit 1.

The second radio wave shorting circuit 8 short-circuits the output terminal 5b of the second nonlinear element 5 at the frequency of the RF signal input through the first terminal 1a of the 90-degree hybrid circuit 1 or at the frequency of the LO wave input through the second terminal 1b of the 90-degree hybrid circuit 1.

Next, an operation in this embodiment will be described.

When an RF signal is input through the first terminal 1a, the 90-degree hybrid circuit 1 equally distributes the input RF signal into the first RF signal and the second RF signal, and then, outputs the first RF signal from the third terminal 1c and outputs the second RF signal from the fourth terminal 1d.

When equally distributing the RF signal input through the first terminal 1a into the first RF signal and the second RF signal, the 90-degree hybrid circuit 1 shifts the phase of the first RF signal by θ degrees, and shifts the phase of the second RF signal by (θ−90) degrees, if the phase of the RF signal input through the first terminal 1a is 0 degrees, for example.

When the LO wave is input through the second terminal 1b, the 90-degree hybrid circuit 1 equally distributes the input LO wave into the first LO wave and the second LO wave, and then, outputs the first LO wave from the third terminal 1c and outputs the second LO wave from the fourth terminal 1d.

When equally distributing the LO wave input through the second terminal 1b into the first LO wave and the second LO wave, the 90-degree hybrid circuit 1 shifts the phase of the first LO wave by (θ−90) degrees and shifts the phase of the second LO wave by θ degrees, if the phase of the LO wave input through the second terminal 1b is 0 degrees, for example.

As the above 0 degree in the 90-degree hybrid circuit 1, any value may be assumed. In the first embodiment, an example of θ=0 will be described in order to simplify the description.

Therefore, in FIG. 1, the phase of the first RF signal and the phase of the first LO wave at the third terminal 1c of the 90-degree hybrid circuit 1 are expressed as follows.

(first RF, first LO)=(0°, −90°)

Further, the phase of the second RF signal and the phase of the second LO wave at the fourth terminal 1d of the 90-degree hybrid circuit 1 are expressed as follows.

(second RF, second LO)=(−90°, 0°)

The first phase shift circuit 2 shifts the phase of the first RF signal output from the third terminal 1c of the 90-degree hybrid circuit 1 from 0 degrees to 180 degrees by shifting the phase of the first RF signal by 180 degrees, and outputs the phase-shifted first RF signal to the first nonlinear element 4.

Further, the first phase shift circuit 2 shifts the phase of the first LO wave output from the third terminal 1c of the 90-degree hybrid circuit 1 from −90 degrees to 90 degrees by shifting the phase of the first LO wave by 180 degrees, and outputs the phase-shifted first LO wave to the first nonlinear element 4.

Thus, the phase of the first RF signal and the phase of the first LO wave output from the first phase shift circuit 2 are expressed as follows.

(first RF, first LO)=(180°, 90°)

Figure 2:
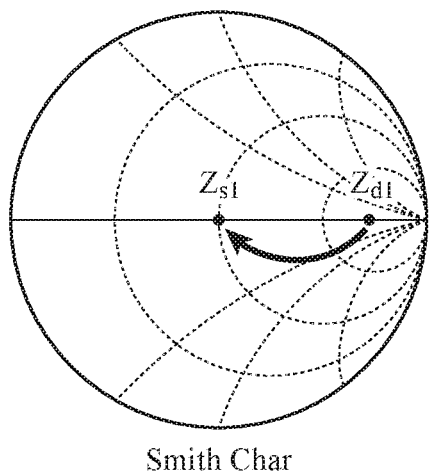
FIG. 2 is a configuration diagram showing impedance conversion by a first phase shift circuit 2.

The first phase shift circuit 2 has a function of shifting the phase of the first RF signal and the phase of the first LO wave, and also has a function of achieving impedance matching between the output impedance $Z_{s1}$ at the third terminal 1c of the 90-degree hybrid circuit 1 and the input impedance $Z_{d1}$ at the input terminal 4a of the first nonlinear element 4 at the frequency of the first RF signal or at the frequency of the first LO wave as shown in FIG. 2.

FIG. 2 is an explanatory view showing impedance conversion by the first phase shift circuit 2.

Since the first phase shift circuit 2 matches the output impedance $Z_{s1}$ at the third terminal 1c with the input impedance $Z_{d1}$ at the input terminal 4a of the first nonlinear element 4, impedance mismatch between the 90-degree hybrid circuit 1 and the first nonlinear element 4 is eliminated.

Thus, in power of the first RF signal and power of the first LO wave output from the third terminal 1c of the 90-degree hybrid circuit 1, power reflected on the input terminal 4a of the first nonlinear element 4 is reduced.

Note that, adjusting the frequency at which the best matching is achieved to a frequency between the frequency of the first RF signal and the frequency of the first LO wave is a design matter.

The second phase shift circuit 3 shifts the phase of the second RF signal output from the fourth terminal 1d of the 90-degree hybrid circuit 1 from −90 degrees to 180 degrees by shifting the phase of the second RF signal by −90 degrees, and outputs the phase-shifted second RF signal to the second nonlinear element 5.

The second RF signal after the phase shift by the second phase shift circuit 3 is in phase with the first RF signal after the phase shift by the first phase shift circuit 2.

In addition, the second phase shift circuit 3 shifts the phase of the second LO wave output from the fourth terminal 1d of the 90-degree hybrid circuit 1 from 0 degrees to −90 degrees by shifting the phase of the second LO wave by −90 degrees, and outputs the phase-shifted second LO wave to the second nonlinear element 5.

The second LO wave after the phase shift by the second phase shift circuit 3 is opposite in phase to the first LO wave after the phase shift by the first phase shift circuit 2.

Thus, the phase of the second RF signal and the phase of the second LO wave which are output from the second phase shift circuit 3 are expressed as follows.

(second RF, second LO)=(180°, −90°)

The second phase shift circuit 3 has a function of shifting the phase of the second RF signal and the phase of the second LO wave, and also has a function of performing impedance matching between the output impedance $Z_{s2}$, at the fourth terminal 1d of the 90-degree hybrid circuit 1 and the input impedance $Z_{d2}$ at the input terminal 5a of the second nonlinear element 5 at the frequency of the second RF signal or at the frequency of the second LO wave.

Since the second phase shift circuit 3 matches the output impedance $Z_{s2}$ at the fourth terminal 1d with the input impedance $Z_{d2}$ at the input terminal 5a of the second nonlinear element 5, impedance mismatch between the 90-degree hybrid circuit 1 and the second nonlinear element 5 is eliminated.

Thus, in power of the second RF signal and power of the second LO wave output from the fourth terminal 1d of the 90-degree hybrid circuit 1, power reflected on the input terminal 5a of the second nonlinear element 5 is reduced.

Note that, adjusting the frequency at which the best matching is achieved to a frequency between the frequency of the second RF signal and the frequency of the second LO wave is a design matter.

Here, the first phase shift circuit 2 and the second phase shift circuit 3 can be constituted by, for example, circuits including transmission lines having a length of a quarter wavelength at the frequency of the RF signal or at the frequency of the LO wave.

Figure 3:
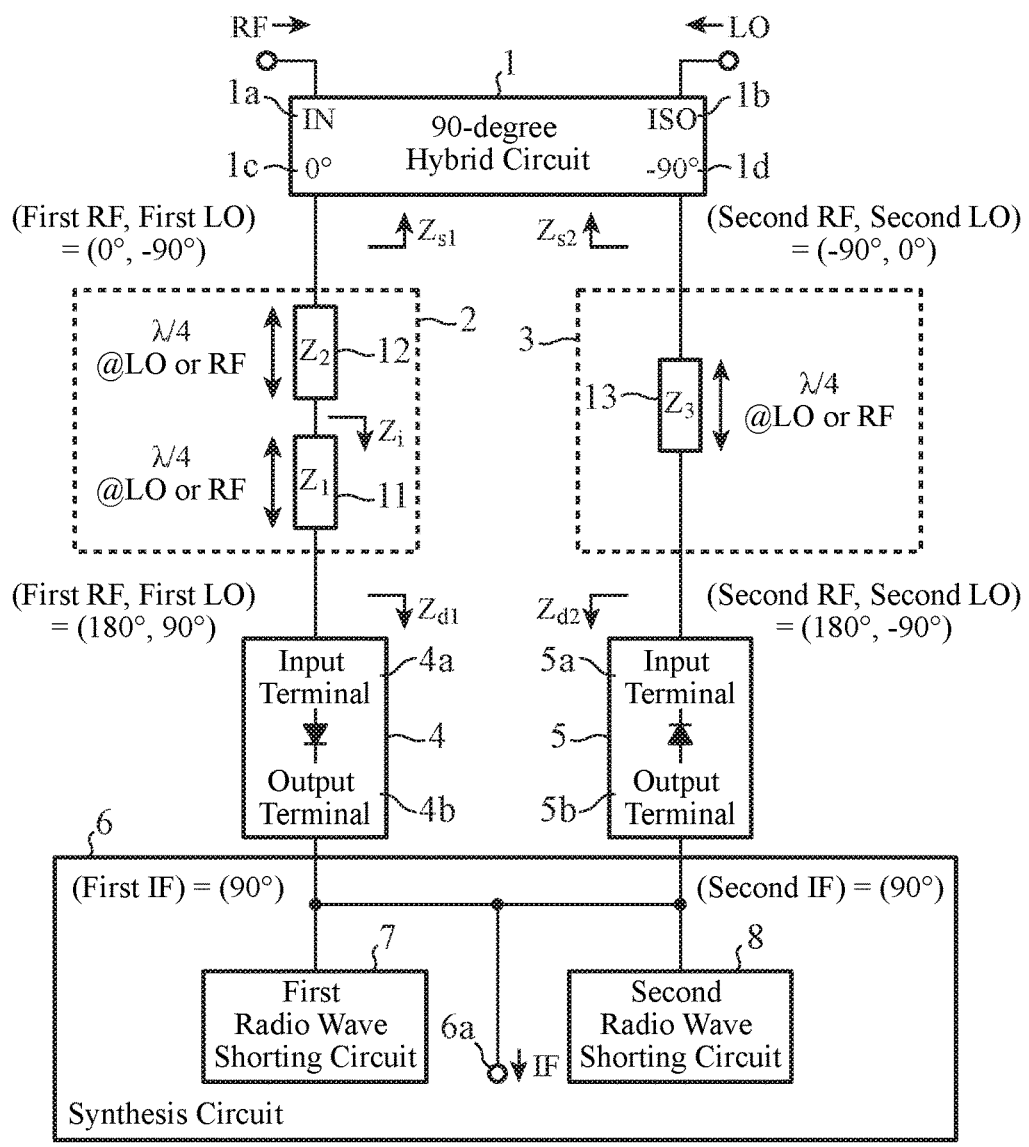
FIG. 3 is a block diagram showing the first phase shift circuit 2 and a second phase shift circuit 3.

FIG. 3 is a block diagram showing the first phase shift circuit 2 and the second phase shift circuit 3.

In FIG. 3, a first transmission line 11 has a length of a quarter wavelength at the frequency of the RF signal input through the first terminal 1a or at the frequency of the LO wave input through the second terminal 1b, the first transmission line 11 being connected to the input terminal 4a of the first nonlinear element 4 at one end. The characteristic impedance of the first transmission line 11 is $Z_1$.

A second transmission line 12 has a length of a quarter wavelength at the frequency of the RF signal input through the first terminal 1a or at the frequency of the LO wave input through the second terminal 1b, the second transmission line 12 being connected to the other end of the first transmission line 11 at one end and being connected to the third terminal 1c of the 90-degree hybrid circuit 1 at the other end. The characteristic impedance of the second transmission line 12 is $Z_2$.

A third transmission line 13 has a length of a quarter wavelength at the frequency of the RF signal input through the first terminal 1a or at the frequency of the LO wave input through the second terminal 1b, the third transmission line 13 being connected to the input terminal 5a of the second nonlinear element 5 at one end and being connected to the fourth terminal 1d of the 90-degree hybrid circuit 1 at the other end. The characteristic impedance of the third transmission line 13 is $Z_3$.

The first phase shift circuit 2 is a series circuit of the first transmission line 11 and the second transmission line 12, and if, for example, each of the first transmission line 11 and the second transmission line 12 has a length of a quarter wavelength at the frequency of the RF signal input through the first terminal 1a, the first phase shift circuit 2 can shift the phase of the first RF signal output from the third terminal 1c of the 90-degree hybrid circuit 1 by 180 degrees.

Since the frequency of the LO wave input through the second terminal 1b is approximately equal to the frequency of the RF signal input through the first terminal 1a, the first phase shift circuit 2 can shift the phase of the first LO wave output from the third terminal 1c of the 90-degree hybrid circuit 1 by approximately 180 degrees.

FIG. 3 shows an example in which the phase of the first LO wave is shifted from −90 degrees to 90 degrees, assuming that an amount of the phase shift of the first LO wave is 180 degrees.

The first phase shift circuit 2 is a series circuit of the first transmission line 11 and the second transmission line 12, and if the characteristic impedance $Z_1$ of the first transmission line 11 is set to the characteristic impedance expressed by the following equation (1), impedance conversion is performed on the real axis having no reactance component.

$$Z_1 = \sqrt{Z_{d1} Z_i} \qquad (1)$$

Further, if the characteristic impedance $Z_2$ of the second transmission line 12 is set to the characteristic impedance expressed by the following equation (2), impedance conversion is performed on the real axis having no reactance component.

$$Z_2 = \sqrt{Z_{s1} Z_i} = \sqrt{\frac{Z_{s1}}{Z_{d1}}} \cdot Z_1 \qquad (2)$$

In equations (1) and (2), $Z_i$ is an input impedance in the first transmission line 11 and may be any value.

Figure 4A:
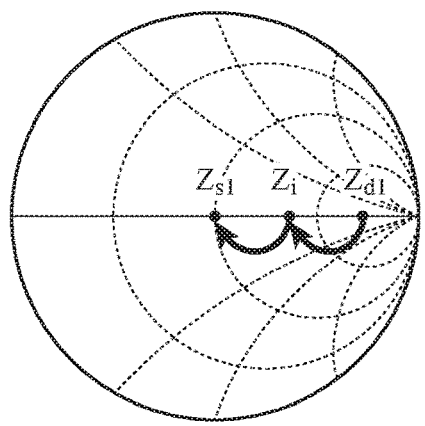
FIG. 4A is an explanatory view for describing impedance conversion by a first transmission line 11 and a second transmission line 12 in the first phase shift circuit 2.

FIG. 4A is an explanatory view showing impedance conversion by the first transmission line 11 and the second transmission line 12 in the first phase shift circuit 2. By setting $Z_1$ and $Z_2$ to have different values, a locus as shown in FIG. 4A can be obtained.

The input impedance $Z_{d1}$ at the input terminal 4a of the first nonlinear element 4 is converted to the output impedance $Z_{s1}$ at the third terminal 1c by the first transmission line 11 and the second transmission line 12, as shown in FIG. 4A.

Thus, the output impedance $Z_{s1}$ at the third terminal 1c and the input impedance $Z_{d1}$ at the input terminal 4a of the first nonlinear element 4 are matched.

If the input impedance $Z_i$ of the first transmission line 11 is higher than the output impedance $Z_{s1}$ at the third terminal 1c, the characteristic impedance $Z_1$ of the first transmission line 11 and the characteristic impedance $Z_2$ of the second transmission line 12 are higher than the output impedance $Z_{s1}$ at the third terminal 1c.

As a result, the line width of the first transmission line 11 and the line width of the second transmission line 12 can be reduced, which facilitates routing of the first transmission line 11 and routing of the second transmission line 12, whereby the layout of the first transmission line 11 and the layout of the second transmission line 12 are facilitated.

If, for example, the third transmission line 13 in the second phase shift circuit 3 has a length of a quarter wavelength at the frequency of the RF signal input through the first terminal 1a, the phase of the second RF signal output from the fourth terminal 1d of the 90-degree hybrid circuit 1 can be shifted by −90 degrees.

Since the frequency of the LO wave input through the second terminal 1b is approximately equal to the frequency of the RF signal input through the first terminal 1a, the second phase shift circuit 3 can shift the phase of the second LO wave output from the fourth terminal 1d of the 90-degree hybrid circuit 1 by approximately −90 degrees.

FIG. 3 shows an example in which the phase of the second LO wave is shifted from 0 degrees to −90 degrees, assuming that an amount of the phase shift of the second LO wave is −90 degrees.

If the characteristic impedance $Z_3$ of the third transmission line 13 in the second phase shift circuit 3 is set to the characteristic impedance expressed by the following equation (3), impedance conversion is performed on the real axis having no reactance component.

$$Z_3 = \sqrt{Z_{s2} Z_{d2}}$$

Figure 4B:
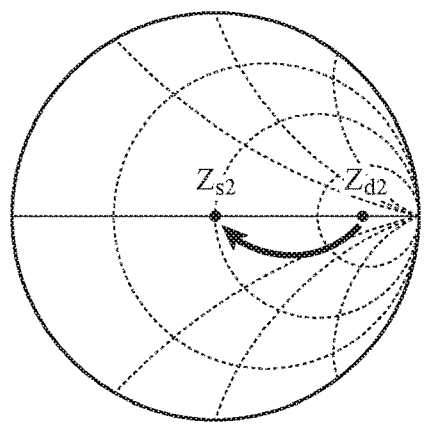
FIG. 4B is an explanatory view for describing impedance conversion by a third transmission line 13 in the second phase shift circuit 3.

FIG. 4B is an explanatory view showing impedance conversion by the third transmission line 13 in the second phase shift circuit 3.

The input impedance $Z_{d2}$ at the input terminal 5a of the second nonlinear element 5 is converted into the output impedance $Z_{s2}$ at the fourth terminal 1d by the third transmission line 13, as shown in FIG. 4B.

Thus, the output impedance $Z_{s2}$ at the fourth terminal 1d and the input impedance $Z_{d2}$ at the input terminal 5a of the second nonlinear element 5 are matched.

The output terminal 4b of the first nonlinear element 4 is short-circuited by the first radio wave shorting circuit 7 at the frequency of the LO wave input through the second terminal 1b of the 90-degree hybrid circuit 1.

The first nonlinear element 4 performs a switching operation in accordance with the amplitude of the first LO wave, thereby mixing the first RF signal output from the first phase shift circuit 2 and the first LO wave output from the first phase shift circuit 2 to generate the first IF signal, and outputs the generated first IF signal to the synthesis circuit 6.

For example, the switching operation and the operation for mixing the RF signal and the LO wave which are performed by the nonlinear element implemented by the diode are known techniques, and thus the detailed description thereof will be omitted.

The first IF signal is a mixed wave of a difference frequency between the first RF signal output from the first phase shift circuit 2 and the first LO wave output from the first phase shift circuit 2, and if the phase of the first RF signal is 180 degrees and the phase of the first LO wave is 90 degrees, the phase of the first IF signal is 90 degrees.

The output terminal 5b of the second nonlinear element 5 is short-circuited by the second radio wave shorting circuit 8 at the frequency of the LO wave input through the second terminal 1b of the 90-degree hybrid circuit 1.

The second nonlinear element 5 performs a switching operation in accordance with the amplitude of the second LO wave, thereby mixing the second RF signal output from the second phase shift circuit 3 and the second LO wave output from the second phase shift circuit 3 to generate the second IF signal, and outputs the generated second IF signal to the synthesis circuit 6.

The second IF signal is a mixed wave of a difference frequency between the second RF signal output from the second phase shift circuit 3 and the second LO wave output from the second phase shift circuit 3. The second nonlinear element 5 is opposite in direction to the first nonlinear element 4. Therefore, if the phase of the second RF signal is 180 degrees and the phase of the second LO wave is −90 degrees, the phase of the second IF signal is 90 degrees.

The synthesis circuit 6 synthesizes the first IF signal output from the first nonlinear element 4 and the second IF signal output from the second nonlinear element 5 in phase, and outputs an IF signal which is the result of the in-phase synthesis to the outside from the input/output terminal 6a.

Here, since the frequency of the RF signal input through the first terminal 1a is approximately equal to the frequency of the LO wave input through the second terminal 1b, the output terminal 4b of the first nonlinear element 4 is also short-circuited by the first radio wave shorting circuit 7 at the frequency of the RF signal, as it is at the frequency of the LO wave.

Similarly, the output terminal 5b of the second nonlinear element 5 is also short-circuited by the second radio wave shorting circuit 8 at the frequency of the RF signal, as it is at the frequency of the LO wave.

Therefore, the first RF signal and the first LO wave passing through the first nonlinear element 4 are not output from the input/output terminal 6a.

Also, the second RF signal and the second LO wave passing through the second nonlinear element 5 are not output from the input/output terminal 6a.

Note that the first LO wave passing through the first nonlinear element 4 and the second LO wave passing through the second nonlinear element 5 are opposite in phase to each other. Therefore, the first LO wave passing through the first nonlinear element 4 and the second LO wave passing through the second nonlinear element 5 are synthesized in opposite phase, and thus, the LO wave is not output from the input/output terminal 6a, even though the output terminal 4b of the first nonlinear element 4 and the output terminal 5b of the second nonlinear element 5 are not short-circuited by the first radio wave shorting circuit 7 and the second radio wave shorting circuit 8. However, since the LO wave has large input power and may leak due to phase imbalance and other factors in actuality, it is better to provide the first radio wave shorting circuit 7 and the second radio wave shorting circuit 8.

The IF signal output from the input/output terminal 6a is a difference frequency signal between the RF signal and the LO wave, and the frequency of the IF signal is low, so that the IF signal is not short-circuited by the first radio wave shorting circuit 7 and the second radio wave shorting circuit 8.

When the amount of the phase shift of the LO wave by the second phase shift circuit 3 is approximately 90 degrees and the deviation from 90 degrees is defined as $\Delta\theta$, and the amount of the phase shift of the LO wave by the first phase shift circuit 2 is approximately 180 degrees and the deviation from 180 degrees is defined as $2\Delta\theta$, the phase difference between the second IF signal generated by the second nonlinear element 5 and the first IF signal generated by the first nonlinear element 4 is $\Delta\theta$. Therefore, $\Delta\theta$ is a factor of synthetic loss in in-phase synthesis of the first IF signal and the second IF signal. Note that, since the frequency of the RF signal and the frequency of the LO wave are approximately equal to each other, $\Delta\theta$ is small and the influence on the loss is small. Further, since $\Delta\theta$ is small, it is possible to adjust the line length up to the synthesis point of the first IF signal and the second IF signal to cancel $\Delta\theta$, and such adjustment is a design matter.

Figure 5A:
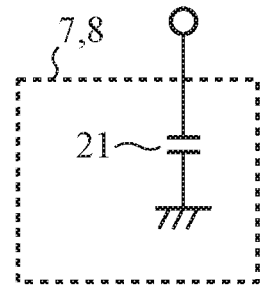
FIG. 5A is a configuration diagram showing an example in which each of a first radio wave shorting circuit 7 and a second radio wave shorting circuit 8 is configured by a capacitor 21.
Figure 5B:
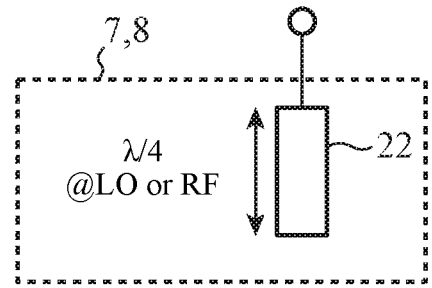
FIG. 5B is a configuration diagram showing an example in which each of the first radio wave shorting circuit 7 and the second radio wave shorting circuit 8 is configured by an open circuited stub 22.

Here, FIGS. 5A and 5B are configuration diagrams showing an example of each of the first radio wave shorting circuit 7 and the second radio wave shorting circuit 8.

FIG. 5A is a configuration diagram showing an example in which the first radio wave shorting circuit 7 and the second radio wave shorting circuit 8 are each formed using a capacitor 21, and FIG. 5B is a diagram showing an example in which the first radio wave shorting circuit 7 and the second radio wave shorting circuit 8 are each formed using an open circuited stub 22.

In FIGS. 5A and 5B, the capacitor 21 is a capacitor which is short-circuited in the vicinity of the frequency of the RF signal input through the first terminal 1a of the 90-degree hybrid circuit 1 or in the vicinity of the frequency of the LO wave input through the second terminal 1b of the 90-degree hybrid circuit 1.

The open circuited stub 22 has a length of a quarter wavelength at the frequency of the RF signal input through the first terminal 1a of the 90-degree hybrid circuit 1 or at the frequency of the LO wave input through the second terminal 1b of the 90-degree hybrid circuit 1.

As apparent from the above, according to the first embodiment, a first phase shift circuit converts impedance to achieve impedance matching between the third terminal of the 90-degree hybrid circuit and a first terminal of a first nonlinear element, and shifts a phase of a radio wave by 180 degrees, and a second phase shift circuit converts impedance to achieve impedance matching between the fourth terminal of the 90-degree hybrid circuit and a second terminal of a second nonlinear element, and shifts a phase of a radio wave by 90 degrees. As a result, an effect of reducing the conversion loss of radio waves is obtained.

That is, in power of the first RF signal and power of the first LO wave output from the third terminal 1c of the 90-degree hybrid circuit 1, power reflected on the input terminal 4a of the first nonlinear element 4 is reduced, whereby conversion loss of radio waves can be reduced.

Further, in power of the second RF signal and power of the second LO wave output from the fourth terminal 1d of the 90-degree hybrid circuit 1, power reflected on the input terminal 5a of the second nonlinear element 5 is reduced, whereby conversion loss of radio waves can be reduced.

The first embodiment shows an example in which the RF signal is input through the first terminal 1a of the 90-degree hybrid circuit 1, and the LO wave is input through the second terminal 1b of the 90-degree hybrid circuit 1. However, no limitation is intended by this example.

For example, the LO wave may be input through the first terminal 1a of the 90-degree hybrid circuit 1, and the RF signal may be input through the second terminal 1b of the 90-degree hybrid circuit 1.

The first embodiment shows an example in which the high frequency mixer is provided with the 90-degree hybrid circuit 1, whereas a Lange coupler may be used as the 90-degree hybrid circuit 1.

The first embodiment shows an example in which the synthesis circuit 6 synthesizes the first IF signal and the second IF signal and outputs the resultant signal to the outside. However, the respective IF signals may be independently output to the outside.

The first embodiment shows an example in which the input terminal 4a of the first nonlinear element 4 is an anode, the output terminal 4b of the first nonlinear element 4 is a cathode, the input terminal 5a of the second nonlinear element 5 is a cathode, and the output terminal 5b of the second nonlinear element 5 is an anode.

It is sufficient that the directions of the first nonlinear element 4 and the second nonlinear element 5 are opposite to each other. Therefore, another example in which the input terminal 4a of the first nonlinear element 4 is a cathode, the output terminal 4b of the first nonlinear element 4 is an anode, the input terminal 5a of the second nonlinear element 5 is an anode, and the output terminal 5b of the second nonlinear element 5 is a cathode may be adopted.

Further, although it is assumed that the first nonlinear element 4 and the second nonlinear element 5 are each implemented by diodes in the first embodiment, it is only sufficient that they can perform a switching operation, and may be implemented by transistors.

Second Embodiment

In a second embodiment, an example in which the high frequency mixer operates as a transmission mixer will be described.

Figure 6:
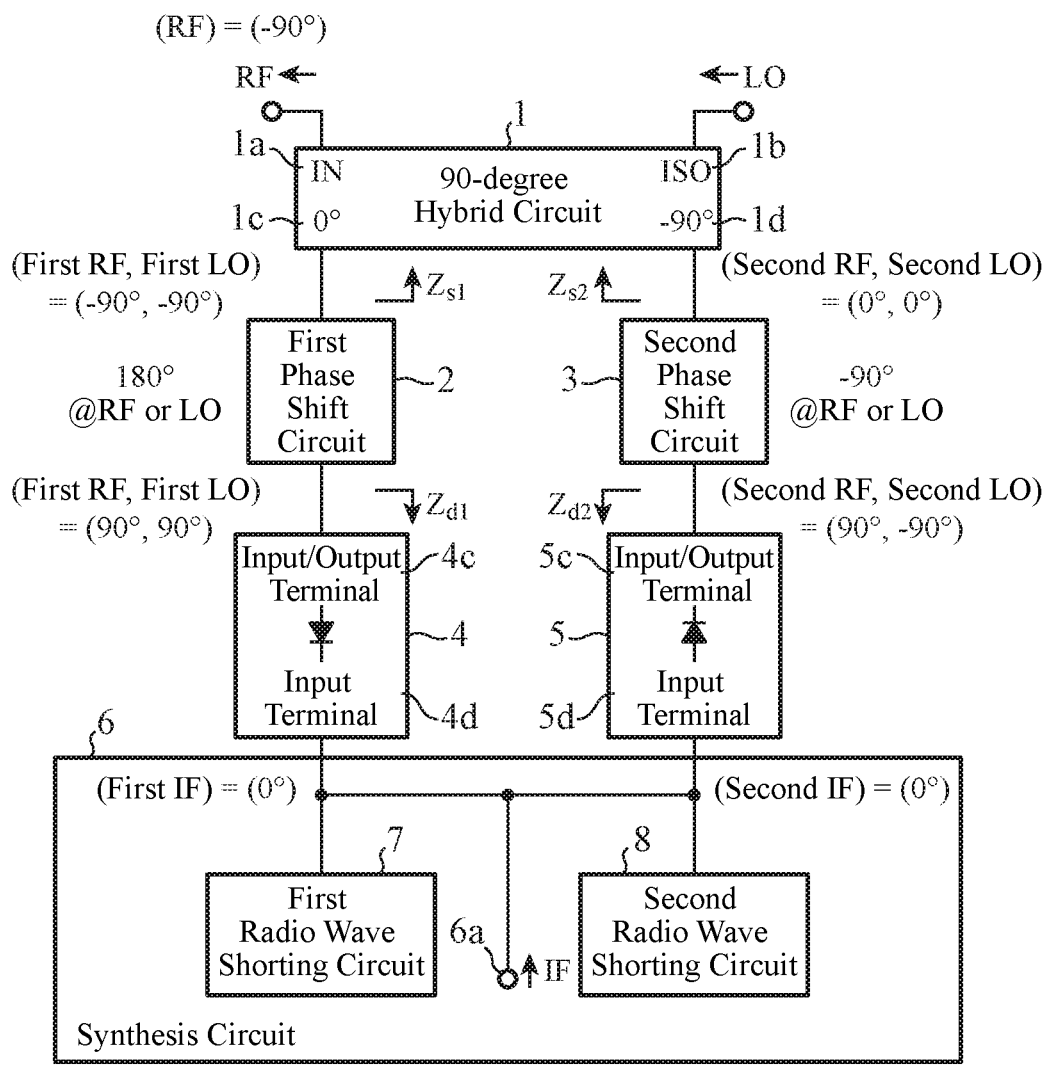
FIG. 6 is a block diagram showing a high frequency mixer according to a second embodiment of the present invention.

FIG. 6 is a block diagram showing a high frequency mixer according to the second embodiment of the present invention.

The configuration of the high frequency mixer shown in FIG. 6 is basically the same as the configuration of the high frequency mixer shown in FIG. 1, except that the terminal of the first nonlinear element 4 on the first phase shift circuit 2 side serves as an input/output terminal, and the terminal of the first nonlinear element 4 on the synthesis circuit 6 side serves as an input terminal.

In addition, the terminal of the second nonlinear element 5 on the second phase shift circuit 3 side serves as an input/output terminal, and the terminal of the second nonlinear element 5 on the synthesis circuit 6 side serves as an input terminal.

The input/output terminal 4c of the first nonlinear element 4 corresponds to the anode that is an anode terminal of the diode, and the input terminal 4d of the first nonlinear element 4 corresponds to the cathode that is a cathode terminal of the diode.

The input/output terminal 5c of the second nonlinear element 5 corresponds to the cathode which is the cathode of the diode, and the input terminal 5d of the second nonlinear element 5 corresponds to the anode which is the anode of the diode.

Next, an operation in this embodiment will be described.

When an LO wave is input through the second terminal 1b, the 90-degree hybrid circuit 1 equally distributes the input LO wave into a first LO wave and a second LO wave, and then, outputs the first LO wave from the third terminal 1c and outputs the second LO wave from the fourth terminal 1d.

When equally distributing the LO wave input through the second terminal 1b into the first LO wave and the second LO wave, the 90-degree hybrid circuit 1 shifts the phase of the first LO wave by ($\theta$−90) degrees and shifts the phase of the second LO wave by $\theta$ degrees, if the phase of the LO wave input through the second terminal 1b is 0 degrees, for example.

As the above 0 degree in the 90-degree hybrid circuit 1, any value may be assumed. In the second embodiment, an example of 0=0 will be described in order to simplify the description.

Therefore, the phase of the first LO wave at the third terminal 1c of the 90-degree hybrid circuit 1 is −90 degrees, and the phase of the second LO wave at the fourth terminal 1d of the 90-degree hybrid circuit 1 is 0 degrees.

The first phase shift circuit 2 shifts the phase of the first LO wave output from the third terminal 1c of the 90-degree hybrid circuit 1 from −90 degrees to 90 degrees by shifting the phase of the first LO wave by 180 degrees.

The first phase shift circuit 2 has a function of shifting the phase of the first LO wave, and also has a function of achieving impedance matching between the output impedance $Z_{s1}$ at the third terminal 1c of the 90-degree hybrid circuit 1 and the input impedance $Z_{d1}$ at the input/output terminal 4c of the first nonlinear element 4 at the frequency of the first RF signal or at the frequency of the first LO wave as shown in FIG. 2.

When the first phase shift circuit 2 matches the output impedance $Z_{s1}$ at the third terminal 1c with the input impedance $Z_{d1}$ at the input/output terminal 4c of the first nonlinear element 4, impedance mismatch between the 90-degree hybrid circuit 1 and the first nonlinear element 4 is eliminated.

Note that, adjusting the frequency at which the best matching is achieved to a frequency between the frequency of the first RF signal and the frequency of the first LO wave is a design matter.

The second phase shift circuit 3 shifts the phase of the second LO wave output from the fourth terminal 1d of the 90-degree hybrid circuit 1 from 0 degrees to −90 degrees by shifting the phase of the second LO wave by −90 degrees.

The second phase shift circuit 3 has a function of shifting the phase of the second LO wave, and also has a function of achieving impedance matching between the output impedance $Z_{s2}$ at the fourth terminal 1d of the 90-degree hybrid circuit 1 and the input impedance $Z_{d2}$ at the input/output terminal 5c of the second nonlinear element 5 at the frequency of the second RF signal or at the frequency of the second LO wave.

When the second phase shift circuit 3 matches the output impedance $Z_{s2}$ at the fourth terminal 1d with the input impedance $Z_{d2}$ at the input/output terminal 5c of the second nonlinear element 5, impedance mismatch between the 90-degree hybrid circuit 1 and the second nonlinear element 5 is eliminated.

Note that, adjusting the frequency at which the best matching is achieved to a frequency between the frequency of the second RF signal and the frequency of the second LO wave is a design matter.

When the IF signal is input through the input/output terminal 6a, the synthesis circuit 6 operates as a distribution circuit that equally distributes the input IF signal into a first IF signal and a second IF signal.

The synthesis circuit 6 outputs the first IF signal to the first nonlinear element 4 and outputs the second IF signal to the second nonlinear element 5.

In the example of FIG. 6, the phase of the input IF signal is 0 degrees, and the phase of the first IF signal and the phase of the second IF signal are each 0 degrees.

The input terminal 4d of the first nonlinear element 4 is short-circuited by the first radio wave shorting circuit 7 at the frequency of the LO wave input through the second terminal 1b of the 90-degree hybrid circuit 1.

The first nonlinear element 4 performs a switching operation in accordance with the amplitude of the first LO wave, thereby mixing the first LO wave output from the first phase shift circuit 2 and the first IF signal output from the synthesis circuit 6 to generate the first RF signal, and outputs the generated first RF signal to the first phase shift circuit 2 from the input/output terminal 4c.

The first RF signal is a mixed wave of a sum frequency of the first LO wave output from the first phase shift circuit 2 and the first IF signal output from the synthesis circuit 6, and the phase of the first RF signal is 90 degrees.

The input terminal 5d of the second nonlinear element 5 is short-circuited by the second radio wave shorting circuit 8 at the frequency of the LO wave input through the second terminal 1b of the 90-degree hybrid circuit 1.

The second nonlinear element 5 performs a switching operation in accordance with the amplitude of the second LO wave, thereby mixing the second LO wave output from the second phase shift circuit 3 and the second IF signal output from the synthesis circuit 6 to generate the second RF signal, and outputs the generated second RF signal to the second phase shift circuit 3 from the input/output terminal 5c.

In the second embodiment, the input/output terminal 5c of the second nonlinear element 5 is a cathode, and the input terminal 5d of the second nonlinear element 5 is an anode. Therefore, the phase of the second RF signal is 90 degrees.

The first phase shift circuit 2 shifts the phase of the first RF signal output from the input/output terminal 4c of the first nonlinear element 4 from 90 degrees to −90 degrees by shifting the phase of the first RF signal by 180 degrees, and outputs the phase-shifted first RF signal to the third terminal 1c of the 90-degree hybrid circuit 1.

The first phase shift circuit 2 has a function of achieving impedance matching between the input impedance $Z_{s1}$ at the third terminal 1c of the 90-degree hybrid circuit 1 and the output impedance $Z_{d1}$ at the input/output terminal 4c of the first nonlinear element 4.

When the first phase shift circuit 2 matches the input impedance $Z_{s1}$ at the third terminal 1c with the output impedance $Z_{d1}$ at the input/output terminal 4c of the first nonlinear element 4, impedance mismatch between the 90-degree hybrid circuit 1 and the first nonlinear element 4 is eliminated.

The second phase shift circuit 3 shifts the phase of the second RF signal output from the input/output terminal 5c of the second nonlinear element 5 from 90 degrees to 0 degrees by shifting the phase of the second RF signal by −90 degrees, and outputs the phase-shifted second RF signal to the fourth terminal 1d of the 90-degree hybrid circuit 1.

The second phase shift circuit 3 has a function of achieving impedance matching between the input impedance $Z_{s2}$ at the fourth terminal 1d of the 90-degree hybrid circuit 1 and the output impedance $Z_{d2}$ at the input/output terminal 5c of the second nonlinear element 5.

When the second phase shift circuit 3 matches the input impedance $Z_{s2}$ at the fourth terminal 1d with the output impedance $Z_{d2}$ at the input/output terminal 5c of the second nonlinear element 5, impedance mismatch between the 90-degree hybrid circuit 1 and the second nonlinear element 5 is eliminated.

When the first RF signal output from the first phase shift circuit 2 is input through the third terminal 1c, and the second RF signal output from the second phase shift circuit 3 is input through the fourth terminal 1d, the 90-degree hybrid circuit 1 synthesizes the first RF signal and the second RF signal, and outputs the RF signal obtained by the in-phase synthesis from the first terminal 1a.

In the example in FIG. 6, the phase of the RF signal output from the first terminal 1a is −90 degrees.

As apparent from the above, according to the second embodiment, the effect of reducing the conversion loss of radio waves can be obtained, as in the first embodiment.

That is, in power of the first RF signal output from the input/output terminal 4c of the first nonlinear element 4, power reflected on the third terminal 1c of the 90-degree hybrid circuit 1 is reduced, whereby conversion loss of radio waves can be reduced.

Further, in power of the second RF signal output from the input/output terminal 5c of the second nonlinear element 5, power reflected on the fourth terminal 1d of the 90-degree hybrid circuit 1 is reduced, whereby conversion loss of radio waves can be reduced.

Third Embodiment

In a third embodiment, a high frequency mixer provided with parallel resonant circuits 31 and 34 will be described.

Figure 7:
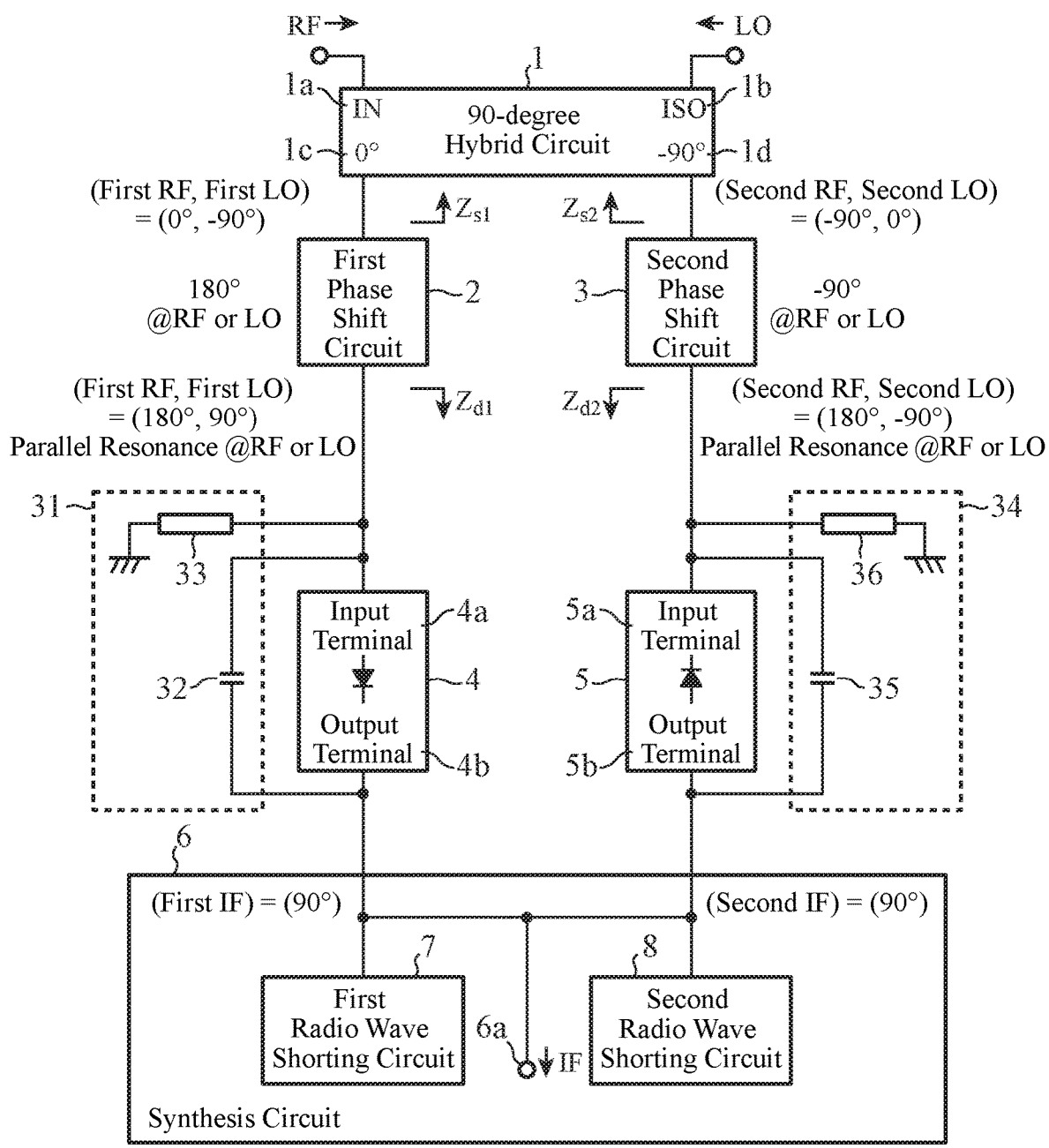
FIG. 7 is a block diagram showing a high frequency mixer according to a third embodiment of the present invention.

FIG. 7 is a block diagram showing a high frequency mixer according to the third embodiment of the present invention. In FIG. 7, the elements identified by the same reference numerals as the elements in FIG. 1 are the same or corresponding elements, and thus, the description thereof will be omitted.

The parallel resonant circuit 31 is provided with a first capacitor 32 and a first short circuited stub 33, and resonates in parallel at the frequency of the RF signal input through the first terminal 1a of the 90-degree hybrid circuit 1 or at the frequency of the LO wave input through the second terminal 1b of the 90-degree hybrid circuit 1.

The first capacitor 32 is connected in parallel to the first nonlinear element 4.

One end of the first short circuited stub 33 is connected between the first phase shift circuit 2 and the first nonlinear element 4.

The parallel resonant circuit 34 is provided with a second capacitor 35 and a second short circuited stub 36, and resonates in parallel at the frequency of the RF signal input through the first terminal 1a of the 90-degree hybrid circuit 1 or at the frequency of the LO wave input through the second terminal 1b of the 90-degree hybrid circuit 1.

The second capacitor 35 is connected in parallel to the second nonlinear element 5.

One end of the second short circuited stub 36 is connected between the second phase shift circuit 3 and the second nonlinear element 5.

FIG. 7 shows an example in which the parallel resonant circuits 31 and 34 are used in the high frequency mixer shown in FIG. 1. However, the parallel resonant circuits 31 and 34 may be used in the high frequency mixer shown in FIG. 6.

The parallel resonant circuit 31 includes the first capacitor 32, and the parallel resonant circuit 34 includes the second capacitor 35. The first capacitor 32 may be a parasitic capacitance of the first nonlinear element 4 or may be an external element. The second capacitor 35 may be a parasitic capacitance of the second nonlinear element 5 or may be an external element.

Each of the first short circuited stub 33 and the second short circuited stub 36 has a length shorter than a quarter wavelength at the resonant frequency of the parallel resonant circuits 31 and 34, and can be regarded as an inductive element or an inductor.

Next, an operation in this embodiment will be described.

The parallel resonant circuits 31 and 34 resonate in parallel at the frequency of the RF signal or at the frequency of the LO wave, and the parallel resonant circuit 31 has the first short circuited stub 33 having a length shorter than a quarter wavelength at the resonant frequency. The parallel resonant circuit 34 has the second short circuited stub 36 having a length shorter than a quarter wavelength at the resonant frequency.

Therefore, even if the first IF signal leaks from the input terminal 4a of the first nonlinear element 4 to the first phase shift circuit 2 side, the first IF signal is reflected on the input terminal 4a of the first nonlinear element 4, because the point where the first short circuited stub 33 is connected is regarded as a short circuit point.

As a result, the power of the first IF signal output from the output terminal 4b of the first nonlinear element 4 to the synthesis circuit 6 is increased.

Further, even if the second IF signal leaks from the input terminal 5a of the second nonlinear element 5 to the second phase shift circuit 3 side, the second IF signal is reflected on the input terminal 5a of the second nonlinear element 5, because the point where the second short circuited stub 36 is connected is regarded as a short circuit point.

As a result, the power of the second IF signal output from the output terminal 5b of the second nonlinear element 5 to the synthesis circuit 6 is increased.

In addition, since the parallel resonant circuits 31 and 34 resonate in parallel at the frequency of the RF signal or at the frequency of the LO wave, the parallel resonant circuits 31 and 34 are open at the frequency of the RF signal or at the frequency of the LO wave, so that influence of increase in loss of the RF signal and the LO wave is small. Therefore, the conversion loss from the RF signal to the IF signal is reduced.

In addition, the parallel resonant circuit 31 includes the first capacitor 32, and the parallel resonant circuit 34 includes the second capacitor 35. Therefore, even when each of the first nonlinear element 4 and the second nonlinear element 5 has a parasitic capacitance, the first short circuited stub 33 and the second short circuited stub 36 can cancel capacitance components due to the parasitic capacitance of the first nonlinear element 4 and the parasitic capacitance of the second nonlinear element 5.

Accordingly, it becomes possible to convert the input impedance $Z_{d1}$ of the first nonlinear element 4 and the input impedance $Z_{d2}$ of the second nonlinear element 5 on the real axis, whereby matching by the first phase shift circuit 2 and the second phase shift circuit 3 is facilitated.

As apparent from the above, according to the third embodiment, it is possible to increase the output power of the IF signal while suppressing an increase in loss of the RF signal.

It is to be noted that two or more of the above embodiments can be freely combined, or any components in the respective embodiments can be modified or omitted, within the scope of the present invention.

INDUSTRIAL APPLICABILITY

The present invention is suitable for high frequency mixers provided with 90-degree hybrid circuits.

REFERENCE SIGNS LIST

1: 90-degree hybrid circuit, 1a: First terminal, 1b: Second terminal, 1c: Third terminal, 1d: Fourth terminal, 2: First phase shift circuit, 3: Second phase shift circuit, 4: First nonlinear element, 4a: Input terminal, 4b: Output terminal, 4c: Input/output terminal, 4d: Input terminal, 5: Second nonlinear element, 5a: Input terminal, 5b: Output terminal, 5c: Input/output terminal, 5d: Input terminal, 6: Synthesis circuit, 6a: Input/output terminal, 7: First radio wave shorting circuit, 8: Second radio wave shorting circuit, 11: First transmission line, 12: Second transmission line, 13: Third transmission line, 21: Capacitor, 22: Open circuited stub, 31: Parallel resonant circuit, 32: First capacitor, 33: First short circuited stub, 34: Parallel resonant circuit, 35: Second capacitor, 36: Second short circuited stub.

The invention claimed is:

1. A high frequency mixer comprising:
a 90-degree hybrid circuit including a first terminal, a second terminal, a third terminal and a fourth terminal, the second terminal being an isolation terminal, the third terminal being a 0-degree output terminal, and the fourth terminal being a −90-degree output terminal when the first terminal is an input terminal for a radio wave;
a first phase shift circuit converting impedance to achieve impedance matching between the third terminal of the 90-degree hybrid circuit and a first terminal of a first nonlinear element, and shifting a phase of the radio wave by 180 degrees; and a second phase shift circuit converting impedance to achieve impedance matching between the fourth terminal of the 90-degree hybrid circuit and a second terminal of a second nonlinear element, and shifting a phase of the radio wave by 90 degrees.

2. The high frequency mixer according to claim 1,
wherein the first phase shift circuit shifts a phase of the radio wave by 180 degrees at a frequency of the radio wave input to or output from the first terminal of the 90-degree hybrid circuit and shifts a phase of a local oscillation wave at a frequency of the local oscillation wave input to or output from the second terminal of the 90-degree hybrid circuit, and
the second phase shift circuit shifts the phase of the radio wave by 90 degrees at the frequency of the radio wave input to or output from the first terminal of the 90-degree hybrid circuit or shifts the phase of the local oscillation wave at the frequency of the local oscillation wave input to or output from the second terminal of the 90-degree hybrid circuit.

3. The high frequency mixer according to claim 2,
wherein the first phase shift circuit includes a first transmission line and a second transmission line connected in series with the first transmission line and different from the first transmission line in characteristic impedance, and
each of the first and second transmission lines has a length of a quarter wavelength at the frequency of the radio wave input to or output from the first terminal of the 90-degree hybrid circuit or the frequency of the local oscillation wave input to or output from the second terminal of the 90-degree hybrid circuit.

4. The high frequency mixer according to claim 3,
wherein the first phase shift circuit includes a series connection between the first transmission line which has one end connected to the first terminal of the first nonlinear element and which has a characteristic impedance $Z_1$, and the second transmission line which has one end connected to the third terminal of the 90-degree hybrid circuit and which has a characteristic impedance $Z_2$, and
the characteristic impedance $Z_1$, the characteristic impedance $Z_2$, an input impedance $Z_{d1}$ at the first terminal of the first nonlinear element, and an output impedance $Z_{s1}$ at the third terminal of the 90-degree hybrid circuit satisfy a following relationship:

$$Z_1 = \sqrt{\frac{Z_{d1}}{Z_{s1}}} \cdot Z_2.$$

5. The high frequency mixer according to claim 4, wherein the characteristic impedance $Z_2$ of the second transmission line is higher than the output impedance $Z_{s1}$ at the third terminal of the 90-degree hybrid circuit.

6. The high frequency mixer according to claim 1, further comprising:
a first radio wave shorting circuit short-circuiting a second terminal of the first nonlinear element at high-frequency; and
a second radio wave shorting circuit short-circuiting a first terminal of the second nonlinear element at high-frequency.

7. The high frequency mixer according to claim 1,
wherein the radio wave is input to the first terminal of the 90-degree hybrid circuit,
a local oscillation wave is input to the second terminal of the 90-degree hybrid circuit, and
the high frequency mixer further includes a synthesis circuit synthesizing a mixed wave obtained by mixing the radio wave and the local oscillation wave and output from a second terminal of the first nonlinear element, and a mixed wave obtained by mixing the radio wave and the local oscillation wave and output from a first terminal of the second nonlinear element.

8. The high frequency mixer according to claim 1, further comprising a distribution circuit equally distributing a radio wave input from a second terminal of the first nonlinear element and a first terminal of the second nonlinear element to the second terminal of the first nonlinear element and the first terminal of the second nonlinear element.

9. The high frequency mixer according to claim 1, further comprising:
a first capacitor connected in parallel with the first nonlinear element; and
a first short circuited stub which has one end connected between the first phase shift circuit and the first nonlinear element,
wherein the first capacitor and the first short circuited stub resonate in parallel at a frequency of the radio wave input through the first terminal of the 90-degree hybrid circuit or a frequency of a local oscillation wave input through the second terminal of the 90-degree hybrid circuit.

10. The high frequency mixer according to claim 1, further comprising:
a second capacitor connected in parallel with the second nonlinear element; and
a second short circuited stub which has one end connected between the second phase shift circuit and the second nonlinear element,
wherein the second capacitor and the second short circuited stub resonate in parallel at a frequency of the radio wave input through the first terminal of the 90-degree hybrid circuit or a frequency of a local oscillation wave input through the second terminal of the 90-degree hybrid circuit.

* * * * *